(12) United States Patent
Tsurumi (10) Patent No.: US 8,552,799 B2
(45) Date of Patent: Oct. 8, 2013

(54) POWER AMPLIFYING CIRCUIT

(75) Inventor: Hiroyuki Tsurumi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 13/418,594

(22) Filed: Mar. 13, 2012

(65) Prior Publication Data

US 2013/0038395 A1 Feb. 14, 2013

(30) Foreign Application Priority Data

Aug. 12, 2011 (JP) ................................. 2011-176970

(51) Int. Cl.
*H03F 3/45* (2006.01)
(52) U.S. Cl.
USPC ............................................ 330/69; 330/260
(58) Field of Classification Search
USPC .......................................... 330/69, 252, 260
See application file for complete search history.

(56) References Cited

U.S. PATENT DOCUMENTS

| 6,107,886 A | 8/2000 | Kusakabe et al. |
| 7,227,409 B2 * | 6/2007 | Chung ............................. 330/69 |
| 7,230,482 B2 * | 6/2007 | Chelli et al. ..................... 330/69 |
| 7,420,413 B2 | 9/2008 | Tsurumi |
| 7,525,375 B2 * | 4/2009 | Bucher et al. ..................... 330/9 |
| 2011/0193631 A1 | 8/2011 | Yasuda et al. |

FOREIGN PATENT DOCUMENTS

JP 3-283804 12/1991

OTHER PUBLICATIONS

U.S. Appl. No. 13/489,098, filed Jun. 5, 2012, Yamauchi, et al.

* cited by examiner

*Primary Examiner* — Henry Choe
(74) *Attorney, Agent, or Firm* — Oblon, Spivak, McClelland, Maier & Neustadt, L.L.P.

(57) ABSTRACT

A power amplifying circuit includes first and second operational amplifiers. The power amplifying circuit includes first to fourth feedback resistor. The power amplifying circuit includes a fully differential operational amplifier that is connected to the output terminal of the first operational amplifier at a non-inverting input terminal thereof, to the output terminal of the second operational amplifier at an inverting input terminal thereof, to a first signal output terminal at a non-inverting output terminal thereof, and to a second signal output terminal at an inverting output terminal thereof and maintains a constant differential gain. The power amplifying circuit includes a switching circuit. The power amplifying circuit includes first and second input resistors. The power amplifying circuit includes a midpoint potential controlling circuit that monitors a power supply voltage and controls the switching circuit.

20 Claims, 5 Drawing Sheets

POWER AMPLIFYING CIRCUIT

CROSS-REFERENCE TO RELATED APPLICATION

This application is based upon and claims the benefit of priority from the prior Japanese Patent Application No. 2011-176970, filed on Aug. 12, 2011, the entire contents of which are incorporated herein by reference.

BACKGROUND

1. Field

Embodiments described herein relate generally to a power amplifying circuit.

2. Background Art

Recently, automobiles that stop their engines when they are not running have become popular. Car audio systems for these automobiles need to be adapted to have an idling stop and start function.

The idling stop and start function is to prevent the audio output from the car audio system from being interrupted by an instantaneous drop of the battery voltage caused by an abrupt load change when the engine is restarted.

The idling stop and start function allows a user to comfortably listen to the audio output from the car audio system even when the engine is restarted.

DETAILED DESCRIPTION

A power amplifying circuit according to an embodiment includes a first operational amplifier connected to a first signal input terminal at a non-inverting input terminal thereof. The power amplifying circuit includes a first feedback resistor connected between an output terminal of the first operational amplifier and an inverting input terminal of the first operational amplifier. The power amplifying circuit includes a second feedback resistor connected to the inverting input terminal of the first operational amplifier at a first end thereof. The power amplifying circuit includes a second operational amplifier connected to a second signal input terminal at a non-inverting input terminal thereof. The power amplifying circuit includes a third feedback resistor connected to an inverting input terminal of the second operational amplifier at a first end thereof and to a second end of the second feedback resistor at a second end thereof. The power amplifying circuit includes a fourth feedback resistor connected between an output terminal of the second operational amplifier and an inverting input terminal of the second operational amplifier.

The power amplifying circuit includes a fully differential operational amplifier that is connected to the output terminal of the first operational amplifier at a non-inverting input terminal thereof, to the output terminal of the second operational amplifier at an inverting input terminal thereof, to a first signal output terminal at a non-inverting output terminal thereof, and to a second signal output terminal at an inverting output terminal thereof and maintains a constant differential gain. The power amplifying circuit includes a switching circuit connected between the second end of the second feedback resistor and the ground. The power amplifying circuit includes a first input resistor connected between the first signal input terminal and a reference terminal to which a reference voltage is applied. The power amplifying circuit includes a second input resistor connected between the second signal input terminal and the reference terminal. The power amplifying circuit includes a midpoint potential controlling circuit that monitors a power supply voltage and controls the switching circuit based on the value of the power supply voltage.

The midpoint potential controlling circuit turns on the switching circuit when the power supply voltage is equal to or higher than a preset switching threshold.

The midpoint potential controlling circuit turns off the switching circuit when the power supply voltage is lower than the switching threshold.

Comparative Example

First, as a reference against which an embodiment is compared, a basic power amplifying circuit that is not adapted for idling stop will be described.

Figure 1:
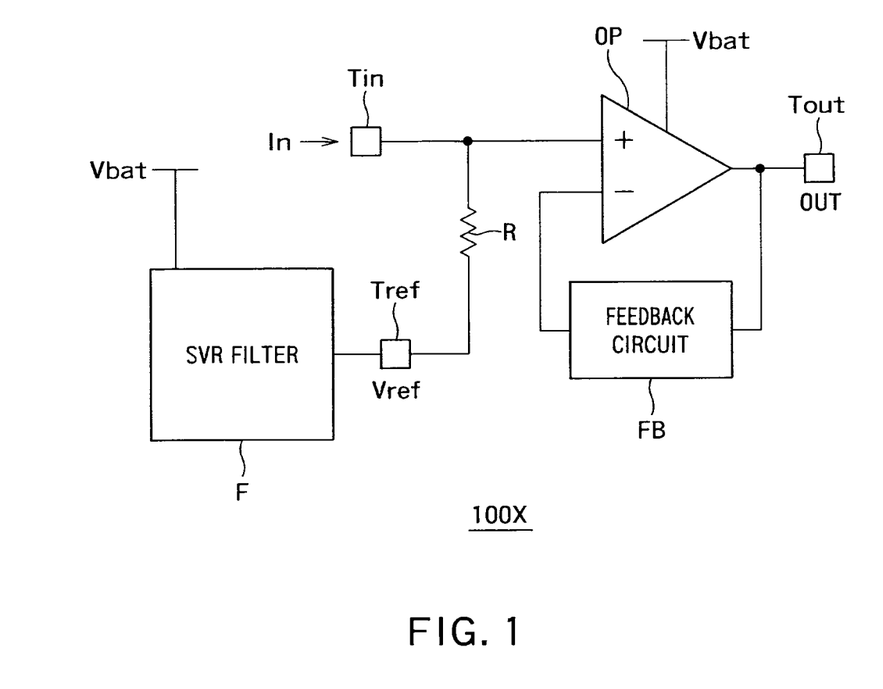
FIG. 1 is a diagram showing a configuration of a power amplifying circuit 100X according to a comparative example that is not adapted for idling stop.
Figure 2:
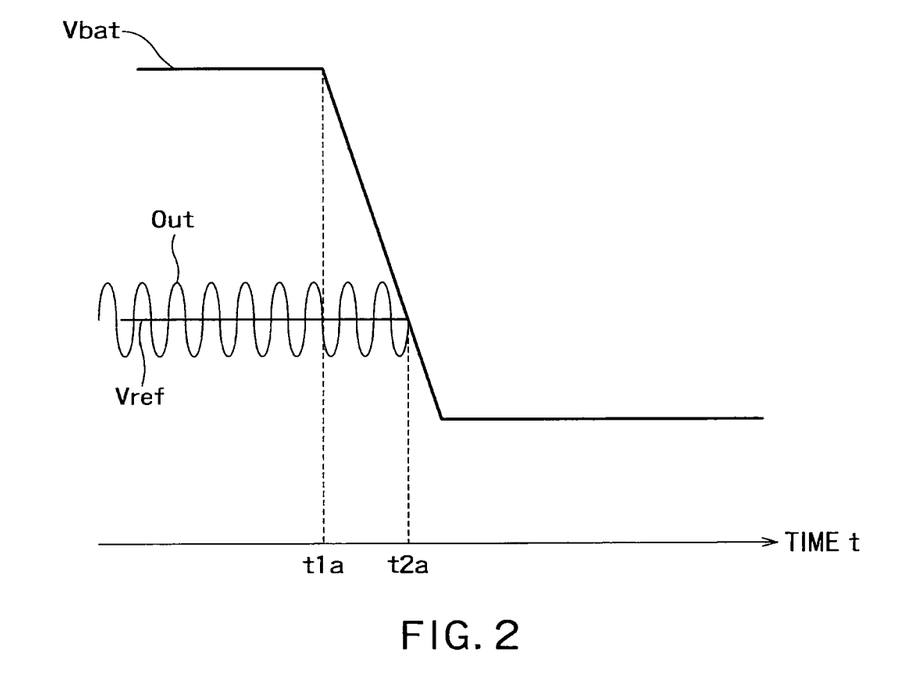
FIG. 2 is a diagram showing a waveform of an operation of the power amplifying circuit 100X according to the comparative example shown in FIG. 1.

FIG. 1 is a diagram showing a configuration of a power amplifying circuit 100X according to a comparative example that is not adapted for idling stop. FIG. 2 is a diagram showing a waveform of an operation of the power amplifying circuit 100X according to the comparative example shown in FIG. 1.

As shown in FIG. 1, the power amplifying circuit 100X includes an operational amplifier OP, a feedback circuit "FB", and a resistor R. A reference voltage "Vref" is supplied through a supply voltage rejection (SVR) filter F to a reference terminal (SVR terminal) "Tref" of the power amplifying circuit 100X.

As shown in FIG. 2, the potential at an output terminal Tout of the power amplifying circuit 100X is approximately equal to the reference voltage "Vref" at the reference terminal Tref and is set at an intermediate voltage of a power supply voltage (battery voltage) "Vbat".

When the power supply voltage "Vbat" is steady, an output waveform Out is normally output (before a time "t1$a$").

However, when the power supply voltage "Vbat" instantaneously drops (from the time "t1$a$"), the potential at the reference terminal cannot follow the change (from a time "t2$a$"). As a result, the output waveform Out collapses.

Thus, when the power supply voltage instantaneously drops, the power amplifying circuit 100X cannot keep a desired output waveform.

That is, the car audio system that incorporates the power amplifying circuit 100X according to the comparative example that is not adapted for idling stop interrupts the audio output and makes the user feel discomfort when the engine is restarted and the battery voltage instantaneously drops because of the abrupt load change.

In the following, a power amplifying circuit capable of keeping a desired output waveform despite an instantaneous drop of a power supply voltage will be proposed by referring to an embodiment.

Now, the embodiment will be described with reference to the drawings.

First Embodiment

Figure 3:
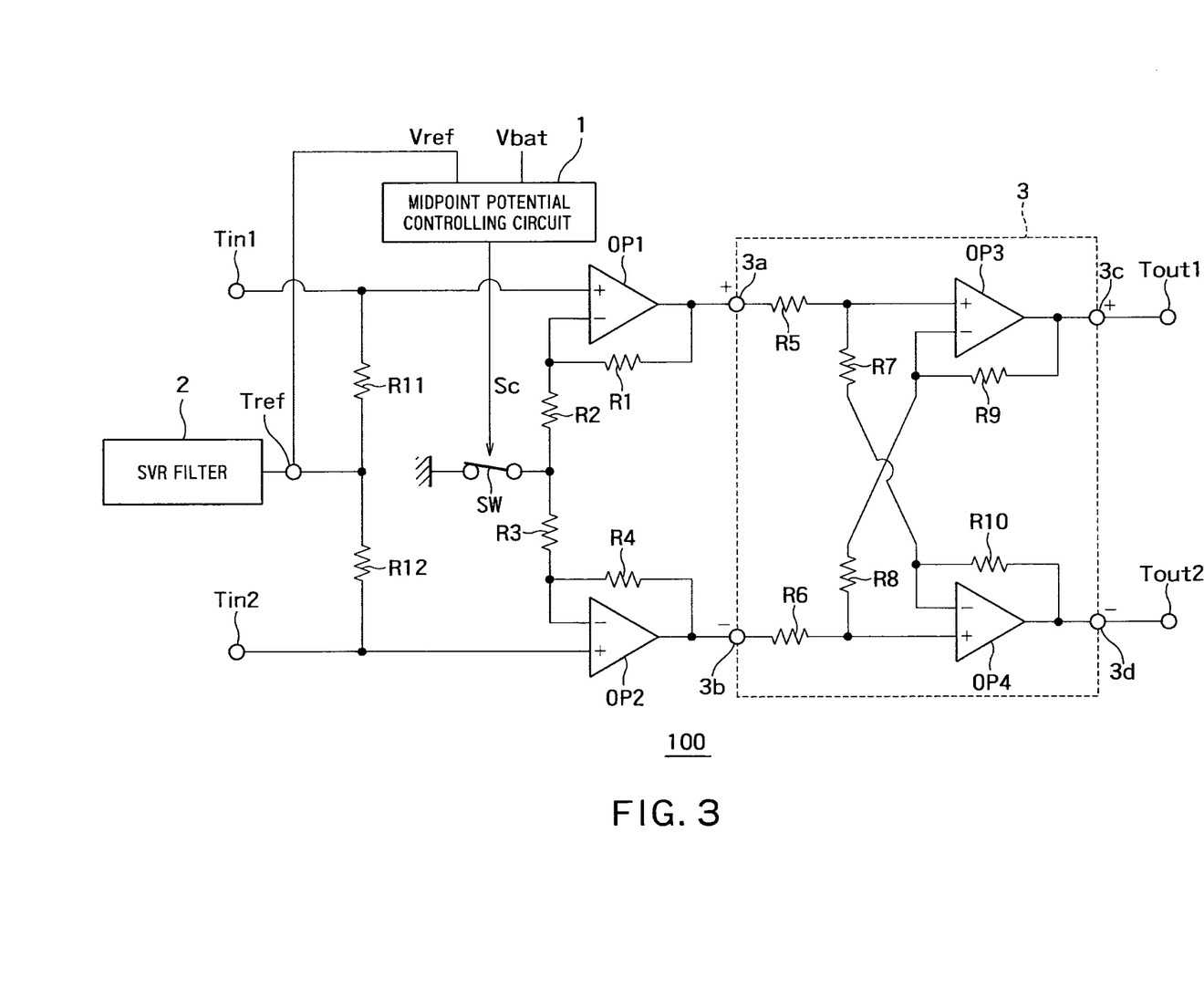
FIG. 3 is a diagram showing an example of a configuration of a power amplifying circuit 100 according to a first embodiment.

FIG. 3 is a diagram showing an example of a configuration of a power amplifying circuit 100 according to a first embodiment.

As shown in FIG. 3, the power amplifying circuit 100 includes a midpoint potential controlling circuit 1, a fully differential operational amplifier 3, a first feedback resistor R1, a second feedback resistor R2, a third feedback resistor R3, a fourth feedback resistor R4, a first input resistor R11, a second input resistor R12, a first operational amplifier OP1, a second operational amplifier OP2, and a switching circuit SW.

The first operational amplifier OP1 is connected to a first signal input terminal Tin1 at a non-inverting input terminal thereof.

The first feedback resistor R1 is connected between an output terminal of the first operational amplifier OP1 and an inverting input terminal of the first operational amplifier OP1.

The second feedback resistor R2 is connected to the inverting input terminal of the first operational amplifier OP1 at one end thereof.

The second operational amplifier OP2 is connected to a second signal input terminal Tin2 at a non-inverting input terminal thereof.

The third feedback resistor R3 is connected to an inverting input terminal of the second operational amplifier OP2 at one end thereof and to the other end of the second feedback resistor R2 at the other end thereof.

The fourth feedback resistor R4 is connected between an output terminal of the second operational amplifier OP2 and the inverting input terminal of the second operational amplifier OP2.

The first to fourth feedback resistors R1 to R4 have a same first resistance Ra, for example.

The fully differential operational amplifier 3 is connected to the output terminal of the first operational amplifier OP1 at a non-inverting input terminal thereof, to the output terminal of the second operational amplifier OP2 at an inverting input terminal thereof, to a first signal output terminal Tout1 at a non-inverting output terminal thereof, and to a second signal output terminal at an inverting output terminal thereof. The fully differential operational amplifier 3 is configured to maintain a constant differential gain.

As shown in FIG. 3, the fully differential operational amplifier 3 includes a fifth feedback resistor R5, a sixth feedback resistor R6, a seventh feedback resistor R7, an eighth feedback resistor R8, a ninth feedback resistor R9, a tenth feedback resistor R10, a third operational amplifier OP3, and a fourth operational amplifier OP4, for example.

The fifth feedback resistor "R5" is connected to the non-inverting input terminal of the fully differential operational amplifier 3 (the output terminal of the first operational amplifier OP1) at one end thereof.

The sixth feedback resistor R6 is connected to the inverting input terminal of the fully differential operational amplifier 3 (the output terminal of the second operational amplifier OP2) at one end thereof.

The seventh feedback resistor R7 is connected to the other end of the fifth feedback resistor R5 at one end thereof.

The eighth feedback resistor R8 is connected to the other end of the sixth feedback resistor R6 at one end thereof.

The third operational amplifier OP3 is connected to the other end of the fifth feedback resistor R5 at a non-inverting input terminal thereof, to the other end of the eighth feedback resistor R8 at an inverting input terminal thereof, and to the non-inverting output terminal of the fully differential operational amplifier 3 (the first signal output terminal Tout1) at an output terminal thereof.

The ninth feedback resistor R9 is connected between the output terminal of the third operational amplifier OP3 and the inverting input terminal of the third operational amplifier OP3.

The fourth operational amplifier OP4 is connected to the other end of the sixth feedback resistor R6 at a non-inverting input terminal thereof, to the other end of the seventh feedback resistor R7 at an inverting input terminal thereof, and to the inverting output terminal of the fully differential operational amplifier 3 (the second signal output terminal Tout2) at an output terminal thereof.

The tenth feedback resistor R10 is connected between the output terminal of the fourth operational amplifier OP4 and the inverting input terminal of the fourth operational amplifier OP4.

In this embodiment, the fifth and sixth feedback resistors R5 and R6 have a same second resistance "Rb", for example.

In this embodiment, the ninth and tenth feedback resistors R9 and R10 have a same third resistance "Rc", for example.

In this embodiment, the resistances of the seventh and eighth feedback resistors R7 and R8 are negligibly small compared with the third resistance "Rc", for example.

The switching circuit SW is connected between the other end of the second feedback resistor R2 and the ground.

The first input resistor R11 is connected between the first signal input terminal Tin1 and the reference terminal (SVR terminal) Tref to which the reference voltage "Vref" is applied.

The second input resistor R12 is connected between the second signal input terminal Tin2 and the reference terminal Tref.

The reference voltage "Vref" is supplied to the reference terminal Tref from an SVR filter 2. The SVR filter 2 generates the reference voltage "Vref" by dividing the power supply voltage "Vbat" into values lower than the intermediate voltage of the power supply voltage "Vbat" and raises the supply voltage rejection ratio with respect to the generated reference voltage "Vref" with a capacitor (not shown) connected between the reference terminal Tref and the ground.

That is, the reference voltage "Vref" is steady even if the power supply voltage "Vbat" varies due to idling stop or the like. The reference voltage "Vref" is set to be a quarter of the power supply voltage "Vbat", for example.

The midpoint potential controlling circuit 1 is configured to monitor the reference voltage "Vref" and the power supply voltage (battery voltage) "Vbat" and control the switching circuit SW according to the value of the power supply voltage "Vbat".

For example, the midpoint potential controlling circuit 1 turns on the switching circuit SW if the power supply voltage "Vbat" is equal to or higher than a preset switching threshold "Vth" (if the power supply voltage "Vbat" is in a steady state), and turns off the switching circuit SW if the power supply voltage "Vbat" is lower than the switching threshold "Vth" (if the power supply voltage "Vbat" instantaneously drops).

The switching threshold "Vth" for the power supply voltage "Vbat" is set at a value with which the first and second operational amplifiers OP1 and OP2 can operate to output a predetermined signal. For example, the switching threshold "Vth" is set based on the reference voltage "Vref". For example, the switching threshold "Vth" is set to be higher than a half of the power supply voltage "Vbat" in the steady state. In this case, the midpoint potential controlling circuit 1 controls the switching circuit SW based on the result of comparison between the power supply voltage "Vbat" and the reference voltage "Vref".

Figure 4:
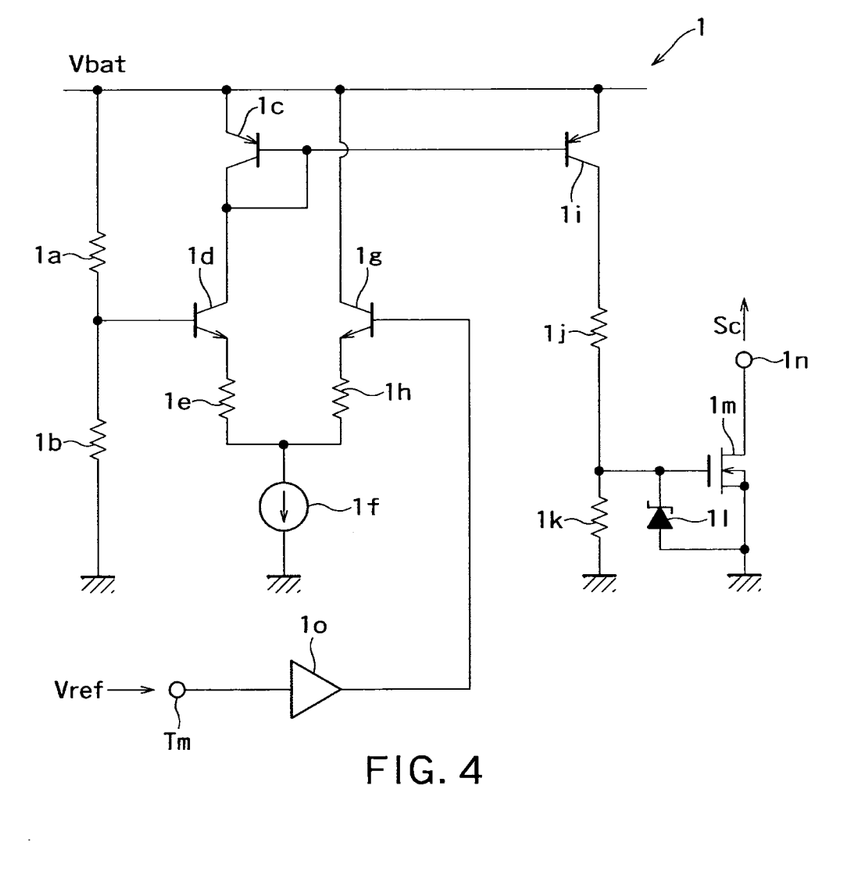
FIG. 4 is a diagram showing an example of a specific circuit configuration of the midpoint potential controlling circuit 1 shown in FIG. 3.

FIG. 4 is a diagram showing an example of a specific circuit configuration of the midpoint potential controlling circuit 1 shown in FIG. 3.

As shown in FIG. 4, the midpoint potential controlling circuit 1 includes resistors $1a$, $1b$, $1e$, $1h$, $1j$ and $1k$, PNP-type bipolar transistors $1c$ and $1i$, NPN-type bipolar transistors $1d$ and $1g$, a constant current source $1f$, a Zener diode $1l$, an nMOS transistor $1m$, an output terminal $1n$, and a level shift circuit $1o$.

The resistor $1a$ is connected to the power supply (battery) at one end thereof.

The resistor $1b$ is connected between the other end of the resistor $1a$ and the ground.

The PNP-type bipolar transistor $1c$ is connected to the power supply at the emitter thereof and is diode-connected.

The NPN-type bipolar transistor $1d$ is connected to the collector of the PNP-type bipolar transistor $1c$ at the collector thereof and to the other end of the resistor $1a$ at the base thereof.

The resistor $1e$ is connected to the emitter of the NPN-type bipolar transistor at one end thereof.

The constant current source $1f$ is connected between the other end of the resistor $1e$ and the ground.

The level shift circuit $1o$ is configured to output a voltage level-shifted from the reference voltage "Vref" input to the reference terminal Tref.

The NPN-type bipolar transistor $1g$ is connected to the power supply at the collector thereof and to the output of the level shift circuit $1o$ at the base thereof.

The resistor $1h$ is connected between the emitter of the NPN-type bipolar transistor $1g$ and one end of the constant current source $1f$.

The PNP-type bipolar transistor $1i$ is connected to the power supply at the emitter thereof and to the base of the PNP-type bipolar transistor $1c$ at the base thereof.

That is, the PNP-type bipolar transistor $1i$ and the PNP-type bipolar transistor $1c$ form a current mirror circuit.

The resistor $1j$ is connected to the collector of the PNP-type bipolar transistor $1i$ at one end thereof.

The resistor $1k$ is connected between the other end of the resistor $1j$ and the ground.

The nMOS transistor $1m$ is connected between the output terminal $1n$ and the ground and connected to the other end of the resistor $1j$ at the gate thereof.

The Zener diode $1l$ is connected to the gate of the nMOS transistor $1m$ at the cathode thereof and to the source of the nMOS transistor $1m$ at the anode thereof.

The midpoint potential controlling circuit 1 configured as described above compares a voltage resulting from division of the power supply voltage "Vbat" by the resistors $1a$ and $1b$ with the voltage level-shifted from the reference voltage "Vref" by the level shift circuit $1o$ and outputs a control signal Sc responsive to the result of the comparison from the output terminal $1n$.

That is, the midpoint potential controlling circuit 1 indirectly compares the power supply voltage "Vbat" with the switching threshold "Vth" based on the reference voltage "Vref" by the operation described above, and outputs the control signal Sc based on the result of the comparison.

Next, an operation, a gain and a DC operating point of the power amplifying circuit configured as described above will be described.

As described above, the power supply voltage "Vbat" is the battery voltage. And it is assumed that the reference terminal Tref is a terminal at which a voltage lower than the intermediate voltage of the power supply voltage "Vbat", for example, a quarter of the power supply voltage "Vbat", is generated, and the supply voltage rejection ratio is raised by an external capacitor. In addition, it is assumed that the input signal is applied to the first signal input terminal Tin1, and the second signal input terminal Tin2 is a virtually grounded point.

First, when the switching circuit SW is in the on state, a gain "K1" of the first operational amplifier OP1 is 2 as shown by the following formula (1).

$$K1=1+R1/R2=1+Ra/Ra=2 \qquad (1)$$

A gain K2 of the second operational amplifier OP2 can be determined in the same way. A differential gain "KA" of the differential output of the first operational amplifier OP1 and the second operational amplifier OP2 is also 2 as shown by the following formula (2) because the output of the second operational amplifier OP2 is an alternating-current ground point since the second signal input terminal Tin2 is a virtually grounded point.

$$KA=K1-K2=2-0=2 \qquad (2)$$

The first operational amplifier OP1 and the second operational amplifier OP2 are multiply-by-two DC amplifiers, and the reference voltage "Vref" at the reference terminal Tref is set to be a quarter of the power supply voltage "Vbat" in the steady state. Therefore, the output potentials of the first operational amplifier OP1 and the second operational amplifier OP2 are a half of the power supply voltage "Vbat", that is, the intermediate potential of the power supply voltage "Vbat".

The differential gain of the fully differential operational amplifier 3, that is, the differential gain from the outputs of the first operational amplifier OP1 and the second operational amplifier OP2 to the first signal output terminal Tout1 and the second signal output terminal Tout2, is denoted by "KB". Since the resistances of the seventh and eighth feedback resistors are negligibly small compared with the resistances of the ninth and tenth feedback resistors as described above, the differential gain "KB" is approximately equal to Rc/Rb.

Therefore, the differential gain (the differential output gain of the first signal output terminal Tout1 and the second signal output terminal Tout2) "K" of the power amplifying circuit 100 when the input signal is input to the first signal input terminal Tin1 is calculated according to K=KA×KB=2Rc/Rb.

The output potentials at the first signal output terminal Tout1 and the second signal output terminal Tout2 are close to the output potentials of the first operational amplifier OP1 and the second operational amplifier OP2 because of the action of the seventh and eighth feedback resistors R7 and R8. If there were not the resistors R7 and R8, the DC gains of the first operational amplifier OP1 and the second operational amplifier OP2 would be substantially infinite, and the output potentials at the terminals Tout1 and Tout2 would not be fixed at a desired voltage. The output potentials at the first signal output terminal Tout1 and the second signal output terminal Tout2 are approximately the intermediate potential of the power supply voltage "Vbat".

On the other hand, when the switching circuit SW is in the off state, the gain "K1" of the first operational amplifier OP1 is 1.5 as shown by the following formula (3).

$$K1=1+R1/(R2+R3)=1+Ra/(2Ra)=1.5 \qquad (3)$$

Similarly, when the switching circuit SW is in the off state, the gain "K2" of the second operational amplifier OP2 is −0.5 as shown by the following formula (4).

$$K2=-R4/(R2+R3)=-Ra/2Ra=-0.5 \quad (4)$$

Therefore, the differential gain "KA" of the outputs of the first operational amplifier OP1 and the second operational amplifier OP2 is 2 as shown by the following formula (5).

$$KA=K1-K2=1.5-(-0.5)=2 \quad (5)$$

Since the switching circuit SW is in the off state, the output potentials of the first operational amplifier OP1 and the second operational amplifier OP2 are approximately equal to the potential at the reference terminal Tref and are a quarter of the power supply voltage "Vbat".

The output potentials at the first signal output terminal Tout1 and the second signal output terminal Tout2 are close to the output potentials of the first operational amplifier OP1 and the second operational amplifier OP2 because of the action of the seventh and eighth feedback resistors R7 and R8. Therefore, the output potentials at the first signal output terminal Tout1 and the second signal output terminal Tout2 are approximately a quarter of the power supply voltage "Vbat".

In addition, since the resistances of the seventh and eighth feedback resistors are negligibly small compared with the resistances of the ninth and tenth feedback resistors as described above, the differential gain "KB" of the fully differential operational amplifier 3 is approximately equal to Rc/Rb.

Therefore, the differential gain (the differential output gain of the first signal output terminal Tout1 and the second signal output terminal Tout2) "K" of the power amplifying circuit 100 when the input signal is input to the first signal input terminal "Tin1" is calculated according to K=KA×KB=2Rc/Rb.

In this way, the differential gain "K" of the power amplifying circuit 100 is always fixed at 2Rc/Rb regardless of whether the switching circuit SW is in the on state or off state. Depending on whether the switching circuit SW is in the on state or off state, only the direct-current output potentials at the first signal output terminal Tout1 and the second signal output terminal Tout2 change to the intermediate voltage of the power supply voltage "Vbat" or a quarter of the power supply voltage "Vbat".

Figure 5:
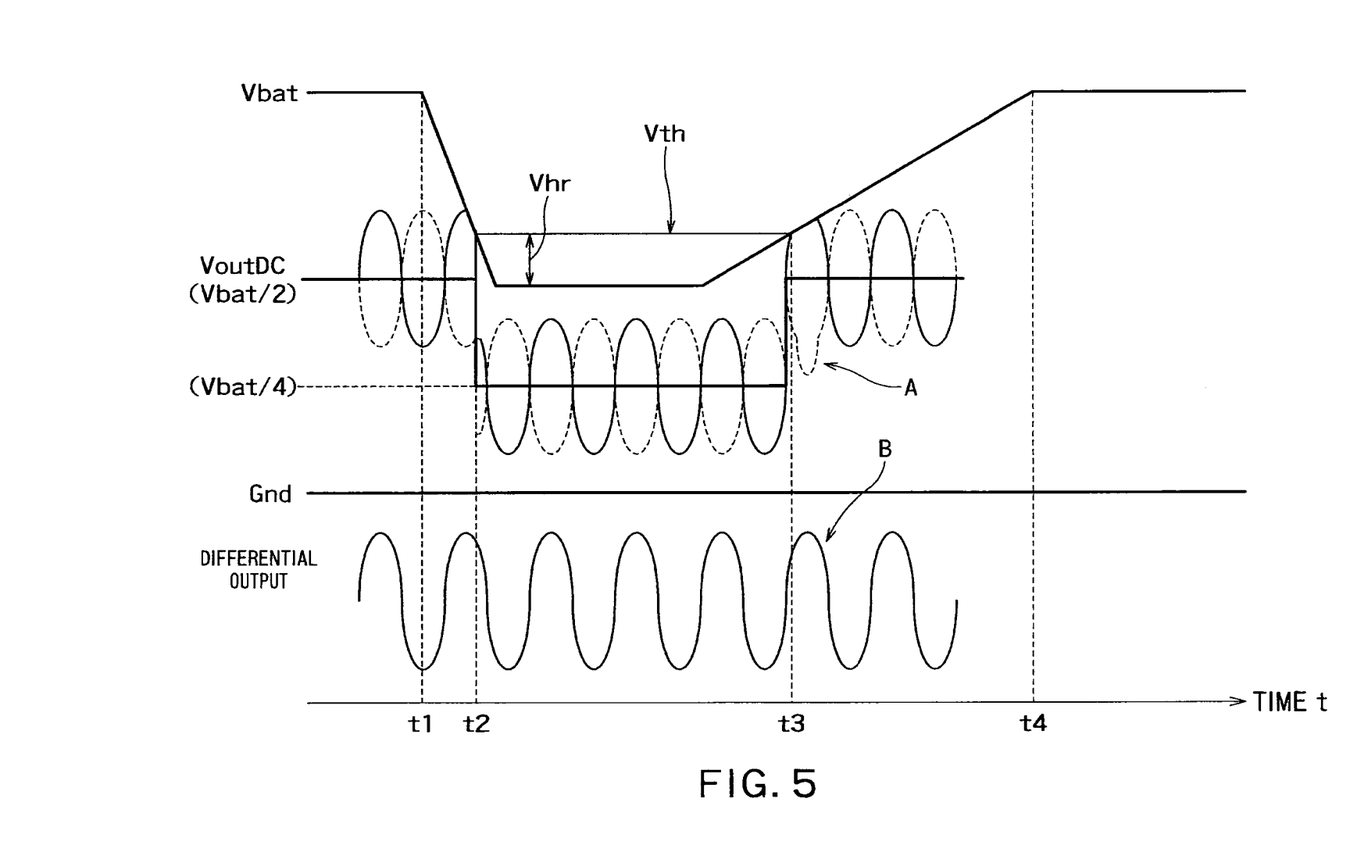
FIG. 5 is a diagram showing an example of a specific waveform of an operation of the power amplifying circuit 100 according to the first embodiment shown in FIG. 3.

Next, an example of a specific waveform of an operation of the power amplifying circuit 100 will be described.

FIG. 5 is a diagram showing an example of a specific waveform of an operation of the power amplifying circuit 100 according to the first embodiment shown in FIG. 3.

In this example, the switching threshold "Vth" is set as shown by the following formula (6). In the formula (6), "Vref" denotes the reference voltage, and "Vhr" denotes a fixed voltage.

$$Vth=2Vref+Vhr \quad (6)$$

In FIG. 5, the waveform of the power supply voltage "Vbat" shows a typical instantaneous drop of the battery voltage that occurs when the engine is restarted after the idling stop state (from a time "t1" to a time "t4"). The power supply voltage (battery voltage) "Vbat" is in the steady state before the time "t1" and after the time "t4".

A direct-current output voltage "VoutDC" is the potential at the first signal output terminal Tout1 and the second signal output terminal Tout2.

For example, if the power supply voltage "Vbat" is higher than the switching threshold "Vth" (before a time "t2" or after a time "t3"), the midpoint potential controlling circuit 1 turns on the switching circuit SW, thereby changing the direct-current output voltage "VoutDC" to a half of the power supply voltage "Vbat".

On the other hand, if the power supply voltage "Vbat" is lower than the switching threshold "Vth" (from the time "t2" to the time "t3"), the midpoint potential controlling circuit 1 turns off the switching circuit SW, thereby changing the direct-current output voltage "VoutDC" to a quarter of the power supply voltage "Vbat".

Then, at the first signal output terminal Tout1 and the second signal output terminal Tout2, a positive-phase output signal and a negative-phase output signal are output. When the instantaneous drop or rise of the waveform of the power supply voltage "Vbat" occurs, clipping may occur at one of the output terminals (as shown by the arrow A in FIG. 5).

However, since the power amplifying circuit 100 according to the first embodiment maintains a constant differential gain, the differential output at the first signal output terminal Tout1 and the second signal output terminal Tout2 always exhibits a desired output waveform even before or after the instantaneous drop of the battery voltage (as shown by the arrow B in FIG. 5).

As described above, the power amplifying circuit according to the first embodiment can keep a desired output waveform even when an instantaneous drop of the power supply voltage occurs.

The car audio system incorporating the power amplifying circuit according to the first embodiment can prevent the audio output from interrupting when the engine is restarted after the idling stop state and the battery voltage instantaneously drops because of an abrupt load change. That is, the user can comfortably listen to the audio output from the car audio system even when the engine is restarted.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A power amplifying circuit, comprising:
   a first operational amplifier connected to a first signal input terminal at a non-inverting input terminal thereof;
   a first feedback resistor connected between an output terminal of the first operational amplifier and an inverting input terminal of the first operational amplifier;
   a second feedback resistor connected to the inverting input terminal of the first operational amplifier at a first end thereof;
   a second operational amplifier connected to a second signal input terminal at a non-inverting input terminal thereof;
   a third feedback resistor connected to an inverting input terminal of the second operational amplifier at a first end thereof and to a second end of the second feedback resistor at a second end thereof;
   a fourth feedback resistor connected between an output terminal of the second operational amplifier and an inverting input terminal of the second operational amplifier;
   a fully differential operational amplifier that is connected to the output terminal of the first operational amplifier at a non-inverting input terminal thereof, to the output terminal of the second operational amplifier at an inverting input terminal thereof, to a first signal output terminal at a non-inverting output terminal thereof, and to a second signal output terminal at an inverting output terminal thereof and maintains a constant differential gain;

a switching circuit connected between the second end of the second feedback resistor and the ground;

a first input resistor connected between the first signal input terminal and a reference terminal to which a reference voltage is applied;

a second input resistor connected between the second signal input terminal and the reference terminal; and a midpoint potential controlling circuit that monitors a power supply voltage and controls the switching circuit based on the value of the power supply voltage, wherein the midpoint potential controlling circuit turns on the switching circuit when the power supply voltage is equal to or higher than a preset switching threshold, and turns off the switching circuit when the power supply voltage is lower than the switching threshold.

2. The power amplifying circuit according to claim 1, wherein the switching threshold for the power supply voltage is set at a value with which the first and second operational amplifiers can operate to output a predetermined signal.

3. The power amplifying circuit according to claim 1, wherein the switching threshold is set based on the reference voltage.

4. The power amplifying circuit according to claim 2, wherein the switching threshold is set based on the reference voltage.

5. The power amplifying circuit according to claim 3, wherein the midpoint potential controlling circuit controls the switching circuit based on the result of comparison between the power supply voltage and the reference voltage.

6. The power amplifying circuit according to claim 4, wherein the midpoint potential controlling circuit controls the switching circuit based on the result of comparison between the power supply voltage and the reference voltage.

7. The power amplifying circuit according to claim 1, wherein the switching threshold is set to be higher than a half of the power supply voltage in a steady state.

8. The power amplifying circuit according to claim 2, wherein the switching threshold is set to be higher than a half of the power supply voltage in a steady state.

9. The power amplifying circuit according to claim 1, wherein the reference voltage is supplied to the reference terminal by an SVR filter, and the SVR filter generates the reference voltage by dividing the power supply voltage into values lower than an intermediate voltage of the power supply voltage and raises the supply voltage rejection ratio with respect to the generated reference voltage with a capacitor connected between the reference terminal and the ground.

10. The power amplifying circuit according to claim 2, wherein the reference voltage is supplied to the reference terminal by an SVR filter, and the SVR filter generates the reference voltage by dividing the power supply voltage into values lower than an intermediate voltage of the power supply voltage and raises the supply voltage rejection ratio with respect to the generated reference voltage with a capacitor connected between the reference terminal and the ground.

11. The power amplifying circuit according to claim 3, wherein the reference voltage is supplied to the reference terminal by an SVR filter, and the SVR filter generates the reference voltage by dividing the power supply voltage into values lower than an intermediate voltage of the power supply voltage and raises the supply voltage rejection ratio with respect to the generated reference voltage with a capacitor connected between the reference terminal and the ground.

12. The power amplifying circuit according to claim 1, wherein the switching threshold is set to a quarter of the power supply voltage.

13. The power amplifying circuit according to claim 1, wherein the first to fourth feedback resistors have a same first resistance.

14. The power amplifying circuit according to claim 1, wherein the fully differential operational amplifier comprises:

a fifth feedback resistor connected to the non-inverting input terminal of the fully differential operational amplifier at a first end thereof;

a sixth feedback resistor connected to the inverting input terminal of the fully differential operational amplifier at a first end thereof;

a seventh feedback resistor connected to a second end of the fifth feedback resistor at a first end thereof;

an eighth feedback resistor connected to a second end of the sixth feedback resistor at first end thereof;

a third operational amplifier connected to the second end of the fifth feedback resistor at a non-inverting input terminal thereof, to a second end of the eighth feedback resistor at an inverting input terminal thereof, and to the non-inverting output terminal of the fully differential operational amplifier at an output terminal thereof;

a ninth feedback resistor connected between the output terminal of the third operational amplifier and the inverting input terminal of the third operational amplifier;

a fourth operational amplifier connected to the second end of the sixth feedback resistor at a non-inverting input terminal thereof, to a second end of the seventh feedback resistor at an inverting input terminal thereof, and to the inverting output terminal of the fully differential operational amplifier at an output terminal thereof; and a tenth feedback resistor connected between the output terminal of the fourth operational amplifier and the inverting input terminal of the fourth operational amplifier.

15. The power amplifying circuit according to claim 2, wherein the fully differential operational amplifier comprises:

a fifth feedback resistor connected to the non-inverting input terminal of the fully differential operational amplifier at a first end thereof;

a sixth feedback resistor connected to the inverting input terminal of the fully differential operational amplifier at a first end thereof;

a seventh feedback resistor connected to a second end of the fifth feedback resistor at a first end thereof;

an eighth feedback resistor connected to a second end of the sixth feedback resistor at first end thereof;

a third operational amplifier connected to the second end of the fifth feedback resistor at a non-inverting input terminal thereof, to a second end of the eighth feedback resistor at an inverting input terminal thereof, and to the non-inverting output terminal of the fully differential operational amplifier at an output terminal thereof;

a ninth feedback resistor connected between the output terminal of the third operational amplifier and the inverting input terminal of the third operational amplifier;

a fourth operational amplifier connected to the second end of the sixth feedback resistor at a non-inverting input terminal thereof, to a second end of the seventh feedback resistor at an inverting input terminal thereof, and to the inverting output terminal of the fully differential operational amplifier at an output terminal thereof; and a tenth feedback resistor connected between the output terminal of the fourth operational amplifier and the inverting input terminal of the fourth operational amplifier.

16. The power amplifying circuit according to claim 3, wherein the fully differential operational amplifier comprises:

a fifth feedback resistor connected to the non-inverting input terminal of the fully differential operational amplifier at a first end thereof;

a sixth feedback resistor connected to the inverting input terminal of the fully differential operational amplifier at a first end thereof;

a seventh feedback resistor connected to a second end of the fifth feedback resistor at a first end thereof;

an eighth feedback resistor connected to a second end of the sixth feedback resistor at first end thereof;

a third operational amplifier connected to the second end of the fifth feedback resistor at a non-inverting input terminal thereof, to a second end of the eighth feedback resistor at an inverting input terminal thereof, and to the non-inverting output terminal of the fully differential operational amplifier at an output terminal thereof;

a ninth feedback resistor connected between the output terminal of the third operational amplifier and the inverting input terminal of the third operational amplifier;

a fourth operational amplifier connected to the second end of the sixth feedback resistor at a non-inverting input terminal thereof, to a second end of the seventh feedback resistor at an inverting input terminal thereof, and to the inverting output terminal of the fully differential operational amplifier at an output terminal thereof; and a tenth feedback resistor connected between the output terminal of the fourth operational amplifier and the inverting input terminal of the fourth operational amplifier.

17. The power amplifying circuit according to claim 4, wherein the fully differential operational amplifier comprises:

a fifth feedback resistor connected to the non-inverting input terminal of the fully differential operational amplifier at a first end thereof;

a sixth feedback resistor connected to the inverting input terminal of the fully differential operational amplifier at a first end thereof;

a seventh feedback resistor connected to a second end of the fifth feedback resistor at a first end thereof;

an eighth feedback resistor connected to a second end of the sixth feedback resistor at first end thereof;

a third operational amplifier connected to the second end of the fifth feedback resistor at a non-inverting input terminal thereof, to a second end of the eighth feedback resistor at an inverting input terminal thereof, and to the non-inverting output terminal of the fully differential operational amplifier at an output terminal thereof;

a ninth feedback resistor connected between the output terminal of the third operational amplifier and the inverting input terminal of the third operational amplifier;

a fourth operational amplifier connected to the second end of the sixth feedback resistor at a non-inverting input terminal thereof, to a second end of the seventh feedback resistor at an inverting input terminal thereof, and to the inverting output terminal of the fully differential operational amplifier at an output terminal thereof; and a tenth feedback resistor connected between the output terminal of the fourth operational amplifier and the inverting input terminal of the fourth operational amplifier.

18. The power amplifying circuit according to claim 14, wherein the fifth and sixth feedback resistors have a same second resistance, the ninth and tenth feedback resistors have a same third resistance, and the resistances of the seventh and eighth feedback resistors are small compared with the third resistance.

19. The power amplifying circuit according to claim 15, wherein the fifth and sixth feedback resistors have a same second resistance, the ninth and tenth feedback resistors have a same third resistance, and the resistances of the seventh and eighth feedback resistors are small compared with the third resistance.

20. The power amplifying circuit according to claim 16, wherein the fifth and sixth feedback resistors have a same second resistance, the ninth and tenth feedback resistors have a same third resistance, and the resistances of the seventh and eighth feedback resistors are small compared with the third resistance.

* * * * *